(12) United States Patent
Maurech et al.

(10) Patent No.: US 10,806,039 B2
(45) Date of Patent: Oct. 13, 2020

(54) HOUSING COMPRISING A FIRST HOUSING PORTION, A SECOND HOUSING PORTION AND A THIRD HOUSING PORTION

(71) Applicant: SAGEMCOM BROADBAND SAS, Rueil Malmaison (FR)

(72) Inventors: Cécile Maurech, Rueil Malmaison (FR); Yann Le Henanff, Rueil Malmaison (FR)

(73) Assignee: SAGEMCOM BROADBAND SAS, Rueil Malmaison (FR)

( * ) Notice: Subject to any disclaimer, the term of this patent is extended or adjusted under 35 U.S.C. 154(b) by 0 days.

(21) Appl. No.: 16/646,062

(22) PCT Filed: Aug. 16, 2018

(86) PCT No.: PCT/EP2018/072196
§ 371 (c)(1),
(2) Date: Mar. 10, 2020

(87) PCT Pub. No.: WO2019/063192
PCT Pub. Date: Apr. 4, 2019

(65) Prior Publication Data
US 2020/0288582 A1 Sep. 10, 2020

(30) Foreign Application Priority Data
Sep. 28, 2017 (FR) ...................................... 17 59035

(51) Int. Cl.
*H05K 5/00* (2006.01)
*H05K 5/02* (2006.01)
(Continued)

(52) U.S. Cl.
CPC ......... *H05K 5/0013* (2013.01); *H05K 5/0221* (2013.01); *F16B 5/0664* (2013.01);
(Continued)

(58) Field of Classification Search
CPC .......... H02G 3/08; H02G 3/081; H02G 3/086; H02G 3/10; H01R 13/46; H01R 13/53;
(Continued)

(56) References Cited

U.S. PATENT DOCUMENTS

| 5,551,589 A | 9/1996 | Nakamura |
| 5,944,210 A * | 8/1999 | Yetter ...................... H02G 3/14 220/4.02 |

(Continued)

FOREIGN PATENT DOCUMENTS

| FR | 2737837 A3 | 2/1997 |
| FR | 2737837 A3 | 2/1997 |

OTHER PUBLICATIONS

English Translation of the Written Opinion of the International Searching Authority Based on International application No. PCT/EP2018/072196; dated Jan. 23, 2019.

*Primary Examiner* — Angel R Estrada
(74) *Attorney, Agent, or Firm* — Muncy, Geissler, Olds & Lowe, P.C.

(57) ABSTRACT

Housing including a first housing portion, a second housing portion and a third housing portion, the first housing portion and the second housing portion comprising latching means formed in a wall of the first housing portion and in a first wall of the second housing portion and arranged so that, when the first housing portion and the second housing portion are assembled, an axial clearance exists along an axis parallel to the wall of the first housing portion and to the first wall of the second housing portion, the second housing portion and the third housing portion comprising complementary adjustment means arranged so that, when the third housing portion is assembled, the axial clearance is reduced and the position of the second housing portion and the third housing portion is adjusted along the axis.

11 Claims, 3 Drawing Sheets

(51) Int. Cl.
*F16B 5/06* (2006.01)
*H05K 7/14* (2006.01)

(52) U.S. Cl.
CPC ......... *H05K 5/0017* (2013.01); *H05K 5/0052* (2013.01); *H05K 7/1417* (2013.01)

(58) Field of Classification Search
CPC .......... H01R 13/533; H05K 5/00; H05K 5/02; H05K 5/0217; H05K 5/04; H05K 5/0013; H05K 5/0221; H05K 5/0052; H05K 5/0017; H05K 7/1417; F16B 5/0664
USPC ....... 174/480, 481, 50, 53, 57, 58, 520, 535, 174/559, 560, 561, 562, 563; 220/3.2–3.9, 4.02; 361/600, 601
See application file for complete search history.

(56) References Cited

U.S. PATENT DOCUMENTS

| | | | | |
|---|---|---|---|---|
| 6,111,760 A * | 8/2000 | Nixon | ................ | H05K 5/0013 220/4.02 |
| 7,208,678 B2 * | 4/2007 | Shinmura | .......... | H05K 7/20927 174/50 |
| 8,013,245 B2 * | 9/2011 | Korcz | .................... | H02G 3/081 174/66 |
| 8,742,255 B2 * | 6/2014 | Pavlovic | ................. | H02G 3/08 174/50 |
| 8,941,009 B2 * | 1/2015 | Makino | .................. | B60R 16/02 174/50 |
| 10,305,267 B2 * | 5/2019 | Kawada | .................. | H02G 3/08 |
| 2014/0290142 A1 | 10/2014 | Dernier | | |
| 2017/0064842 A1 | 3/2017 | Dernier | | |

\* cited by examiner

HOUSING COMPRISING A FIRST HOUSING PORTION, A SECOND HOUSING PORTION AND A THIRD HOUSING PORTION

The invention relates to the field of boxes comprising a first box portion, a second box portion, and a third box portion.

BACKGROUND OF THE INVENTION

Very numerous boxes comprise a plurality of box portions that are made of plastics material and that are assembled together in order to make the boxes.

By way of example (but not necessarily), such boxes are boxes for electrical equipment: boxes for decoders, for residential gateways, for electricity meters, etc.

The box portions need to be fastened mechanically to one another, and their relative positions need to be properly adjusted.

For boxes that comprise two box portions, mechanical fastening is conventionally provided by snap fastening, and, by way of example, the relative position of the box portions may be adjusted by setting the thickness of a margin, by adding one or more indentations, by implementing a function for centering and positioning one box portion relative to the other, etc.

The relative positions need to be accurately adjusted. Specifically, if the snap fastening is too tight, then the box portions might not be assembled together. If the snap fastening is not tight enough, then there is too much clearance between the two box portions. Likewise, if the margins or the indentations are not of the right thickness, then unevenness can be observed.

Naturally, the above-mentioned problems become much more difficult to solve when the box comprises three box portions.

Under such circumstances, conventional solutions consist either in accepting an offset between the box portions, possibly having resort to an artifice of appearance in order to make said offset acceptable, or in devising box portions that are paired, or else in using very fine tolerances for dimensions. Naturally, the last two possibilities are very expensive.

OBJECT OF THE INVENTION

An object of the invention is to assemble accurately a box comprising a first box portion, a second box portion, and a third box portion, without increasing the cost of fabricating said box and without using an artifice of appearance.

SUMMARY OF THE INVENTION

In order to achieve this object, there is provided a box comprising a first box portion, a second box portion, and a third box portion, the first box portion and the second box portion including complementary snap fastener means formed in a wall of the first box portion and in a first wall of the second box portion and arranged so that, when the first box portion and the second box portion are assembled together, and in the absence of the third box portion, axial clearance exists along an axis parallel to the wall of the first box portion and to the first wall of the second box portion, which walls are parallel to each other, the second box portion and the third box portion including complementary adjustment means arranged so that, when the third box portion is assembled with the first box portion and the second box portion, the axial clearance is reduced and the position of the second box portion and of the third box portion is adjusted along the axis.

The complementary adjustment means thus make it possible to adjust the position of the second box portion and of the third box portion, and to reduce the axial clearance between the first box portion and the second box portion. Thus, by means of the complementary snap fastener means and the complementary adjustment means, the first box portion, the second box portion, and the third box portion are secured to one another and their relative positions are adjusted in very accurate manner.

This very accurate adjustment does not require the first box portion, the second box portion, and the third box portion to be fabricated with very fine tolerances for their design dimensions. The cost of manufacture is thus not increased.

The accuracy with which the box is made means there is no point in any artifice of appearance.

There is also provided a method of making a box similar to that described above, the method comprising the steps of:
  assembling together the first box portion, the second box portion, and the third box portion;
  securing the third box portion to the first box portion.

Other characteristics and advantages of the invention appear on reading the following description of particular, nonlimiting embodiments of the invention.

BRIEF DESCRIPTION OF THE DRAWINGS

Reference is made to the accompanying drawings, in which.

DETAILED DESCRIPTION OF THE INVENTION

Figure 1:
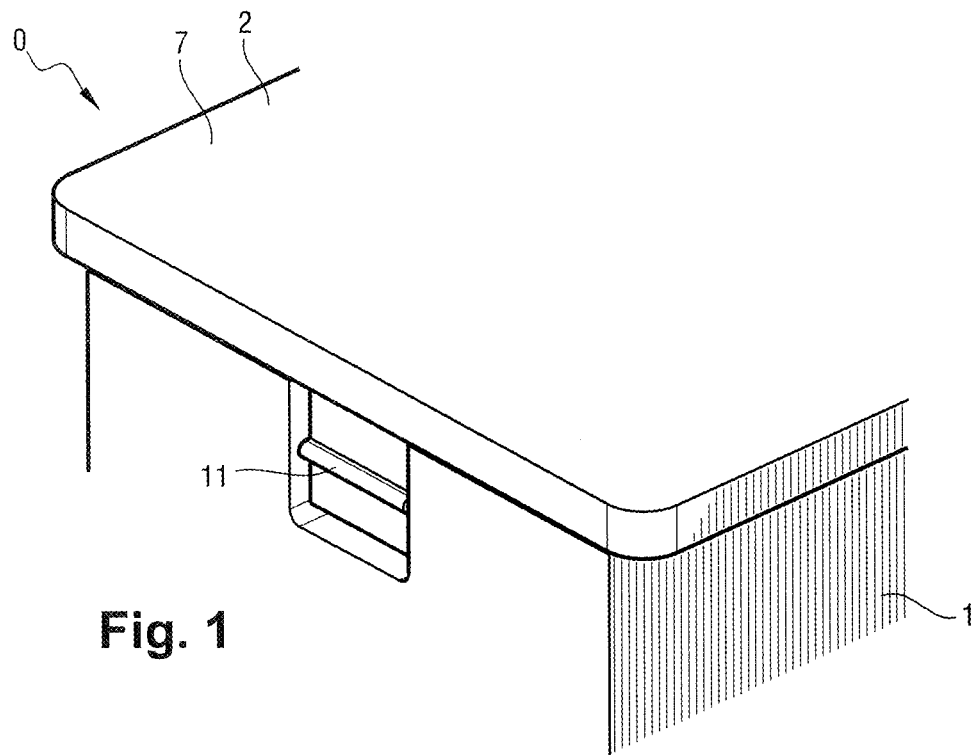
FIG. 1 shows a first box portion and a second box portion of a box in a first embodiment of the invention.
Figure 2:
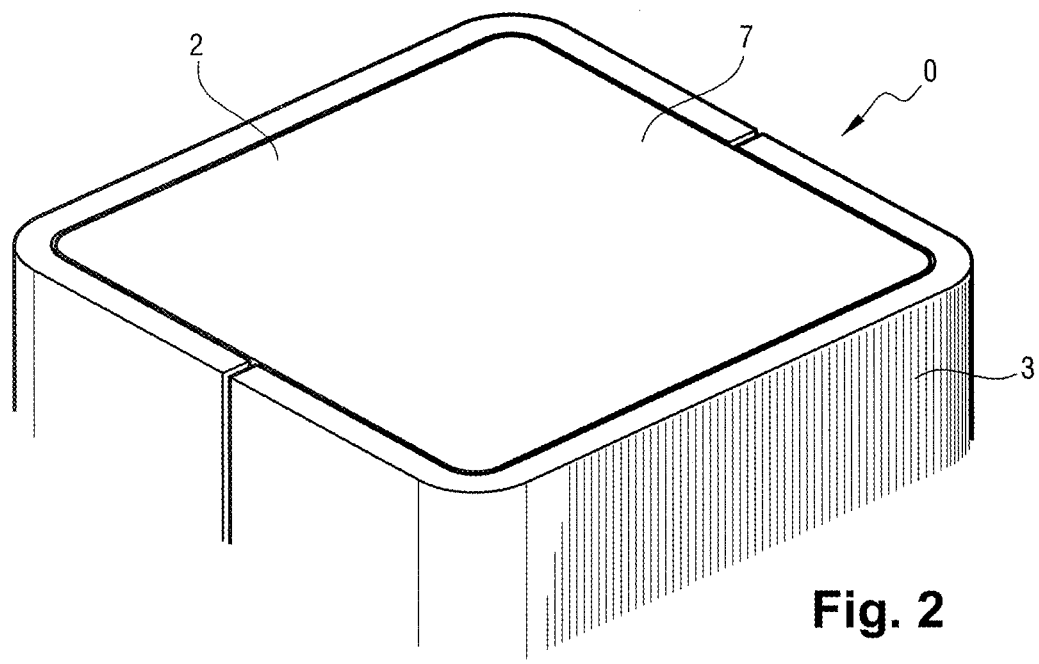
FIG. 2 shows the second box portion together with a third box portion.
Figure 3:
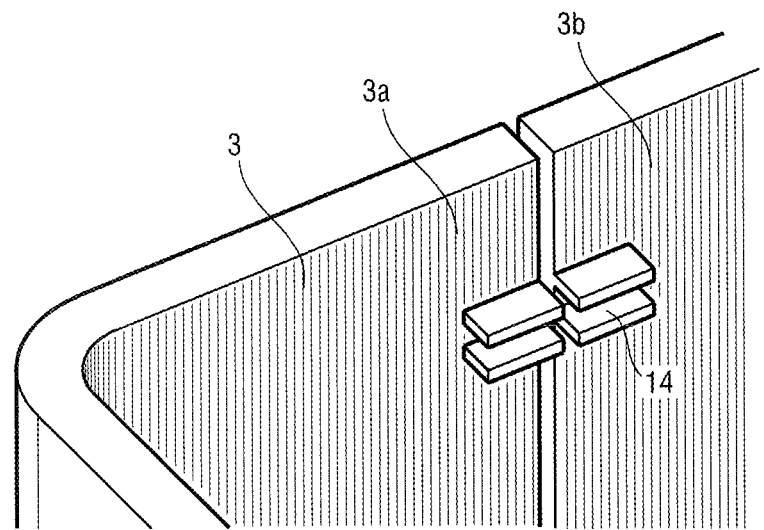
FIG. 3 shows the third box portion.
Figure 4:
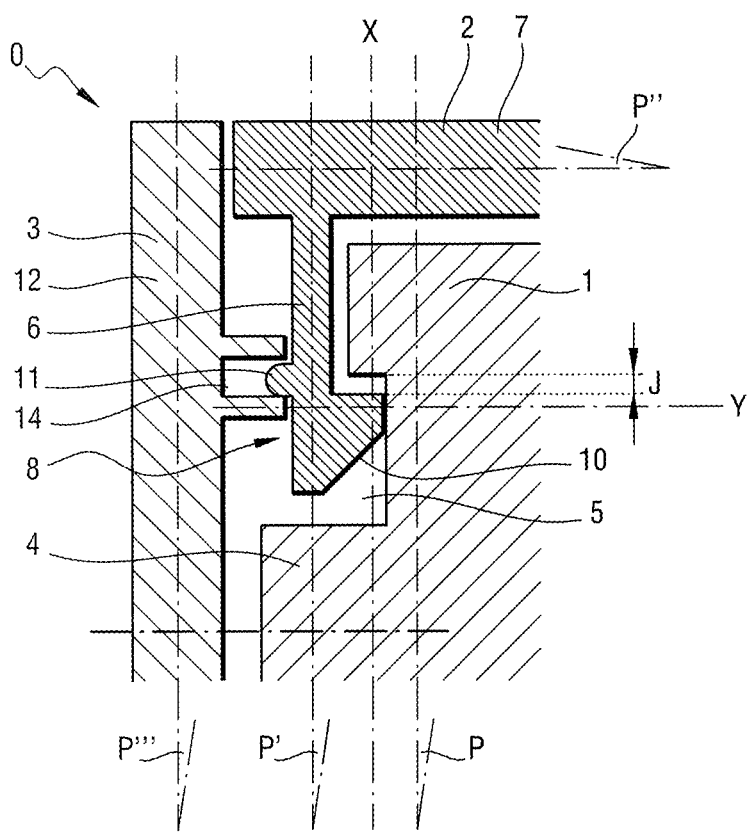
FIG. 4 is a section view of the complementary snap fastener means and of the complementary adjustment means of the box, in a plane perpendicular to the first wall and to the second wall.

With reference to FIGS. 1 to 4, a box 0 in a first embodiment of the invention comprises a first box portion 1, a second box portion 2, and a third box portion 3. The first box portion 1, the second box portion 2, and the third box portion 3 are made of plastics material.

The first box portion 1 and the second box portion 2 define an inside volume of the box 0.

The first box portion 1 has a wall 4 that lies in a plane P.

A first recess 5 is formed in the wall 4 of the first box portion 1.

The second box portion 2 has a first wall 6 and a second wall 7. The first wall 6 lies in a plane P' that is parallel to the plane P when the first box portion 1 and the second box portion 2 are assembled together. The second wall 7 lies in a plane P''' perpendicular to the plane P'. The second wall 7 of the second box portion 2 forms a lid for the box 0.

A flexible catch tab 8 is made in the thickness of the first wall 6 of the second box portion 2.

The flexible catch tab 8 presents a first face and a second face opposite from the first face.

The first face of the flexible catch tab 8 lies partially facing the first recess 5 when the first box portion 1 and the second box portion 2 are assembled together. The first face presents a slope 10 facing towards the first recess 5 when the first box portion 1 and the second box portion 2 are assembled together. The slope 10 forms a hook and extends from a free end of the flexible catch tab 8.

A lug 11 is formed on the first wall 6 of the second box portion 2. The lug 11 is situated on the second face of the flexible catch tab 8. The lug 11 extends longitudinally over the entire width of the flexible catch tab 8.

The third box portion 3 comprises a wall 12 that lies in a plane P''' that is parallel to the plane P and to the plane P' when the first box portion 1, the second box portion 2, and the third box portion 3 are assembled together.

The third box portion 3 comprises similar first and second parts 3a and 3b.

A second recess 14 is formed on the wall 12 of the third box portion 3. The second recess 14 lies half on the first part 3a and half on the second part 3b. The second recess 14 extends longitudinally over a length that is close to the length of the lug 11.

The way in which the first box portion 1, the second box portion 2, and the third box portion 3 are assembled together is described below in greater detail.

The first recess 5 in the wall 4 of the first box portion 1 and the flexible catch tab 8 of the first wall 6 of the second box portion 2 constitute complementary snap fastener means. The term "snap fastener" is used herein to designate resilient engagement of one part in another.

When the first box portion 1 and the second box portion 2 are assembled together, the complementary snap fastener means enable the second box portion 2 to be secured to the first box portion 1. The wall 4 of the first box portion 1 and the first wall 6 of the second box portion 2 are parallel to each other. Axial clearance J exists between the first box portion 1 and the second box portion 2 along an axis X parallel to the wall 4 of the first box portion 1 and to the first wall 6 of the second box portion 2, i.e. parallel to the plane P and the plane P'. The second box portion 2 is thus held while being floatingly mounted to the first box portion 1. The axial clearance J may be quite large, e.g. greater than 0.5 millimeters (mm).

Thereafter, the third box portion 3 is assembled with the first box portion 1 and the second box portion 2.

The first part 3a and the second part 3b of the third box portion 3 are adjusted and aligned relative to each other. The lug 11 of the second box portion 2 and the second recess 14 of the third box portion 3 form complementary adjustment means.

The complementary adjustment means are arranged in such a manner that, when the third box portion 3 is assembled with the first box portion 1 and with the second box portion 2, the lug 11 penetrates into the second recess 14. The axial clearance of the lug 11 positioned in the second recess 14 is very small. The third box portion 3 thus finalizes functionally adjusting the second box portion 2 along the axis X: the positions of the second box portion 2 and of the third box portion 3 are adjusted along the axis X.

The third box portion 3 is then adjusted relative to the first box portion 1, and it is then secured to the first box portion 1, by screw fastening, by snap fastening, by adhesive, or by thermoplastic staking.

The first box portion 1, the second box portion 2, and the third box portion 3 are thus secured to one another, and their relative positions are properly adjusted along the axis X.

Adjustment along the axis X is thus performed in an adjustment zone that is very close to the second wall 7 of the second box portion 2 and to the wall 12 of the third box portion 3, which are the walls of the box 0 that are visible from the outside. As a result, no offset of the wall is visible from outside the box 0.

It is known that while fabricating parts made of plastics material, such plastics-material parts tend to shrink after injection. In this example, since the adjustment zone is very close to the second wall 7 of the second box portion 2 and to the wall 12 of the third box portion 3, the lengths in question are very small and adjustment is well controlled, and thus very accurate.

It is thus possible to obtain adjustment to within less than 0.2 mm, whereas the tolerances obtained in a conventional box made up of parts having similar tolerances on their design dimensions, would be adjusted to within more than 0.8 mm.

It should be observed that the system for indexing the third box portion 3 on the first box portion 1 can be made by indexing means situated on the first box portion 1 and on the third box portion 3, or else by using one or more added elements, such as for example a pin, a sheath, etc. The added element(s) may be crimped, thermoplastically staked, adhesively bonded, etc.

It should also be observed that the third box portion 3 stresses the hook of the flexible catch tab 8 in the first recess 5, thereby also adjusting the relative positions of the first box portion 1, of the second box portion 2, and of the third box portion 3 along an axis Y that is perpendicular to the axis X and to the planes P, P', and Pa'.

Figure 5:
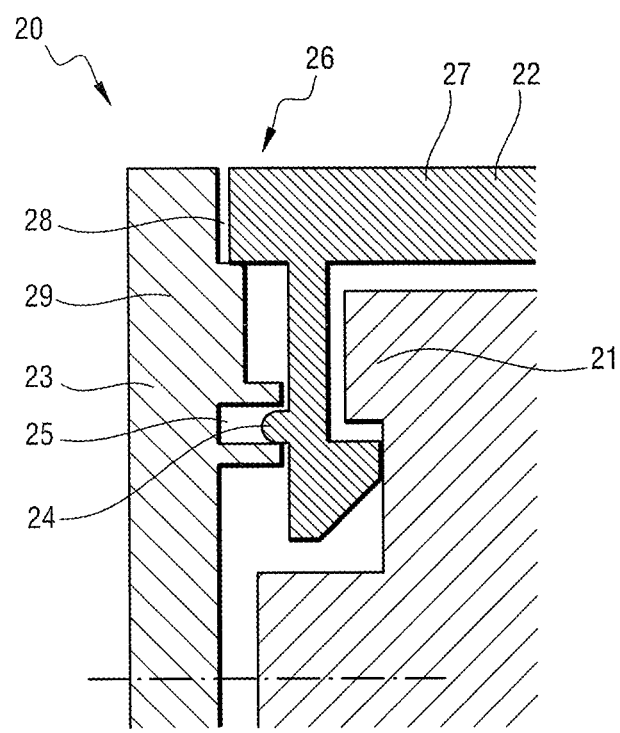
FIG. 5 is a view analogous to the view of FIG. 4, for a box in a second embodiment of the invention.

With reference to FIG. 5, a box 20 in a second embodiment of the invention comprises once again a first box portion 21, a second box portion 22, and a third box portion 23.

Once again, the complementary adjustment means comprise a lug 24 and a recess 25 that are similar to the lug 11 and to the second recess 14 as described above, together with an end 26 of the second wall 27 of the second box portion 22 and a shoulder 28 formed in the wall 29 of the third box portion 23.

Adjustment can thus take place immediately under the lid of the box 20, thereby further improving the accuracy of the adjustment.

Figure 6:
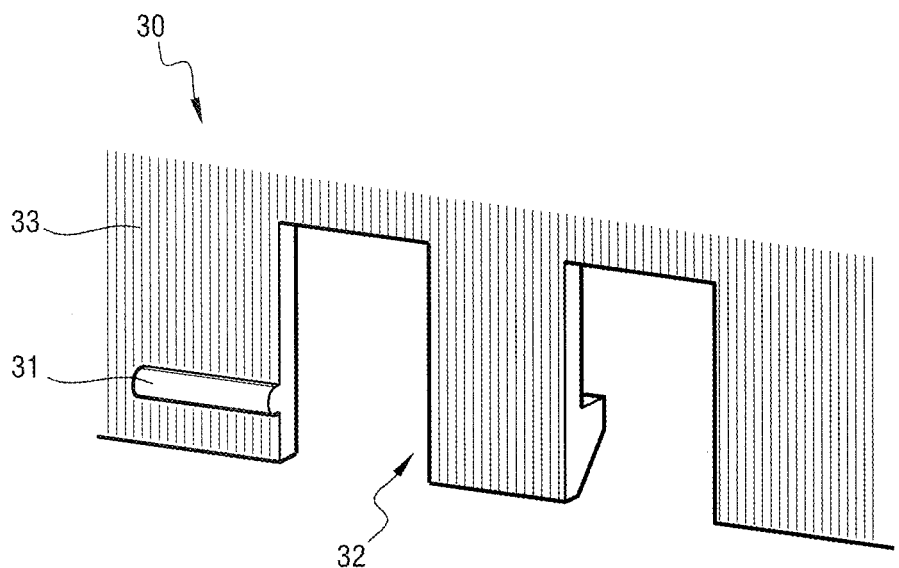
FIG. 6 shows complementary snap fastener means and complementary adjustment means of a box in a third embodiment of the invention.

With reference to FIG. 6, the complementary adjustment means of a box 30 in a third embodiment of the invention are similar to those of the first embodiment, except that the lug 31 is not situated on the second face of the flexible catch tab 32, but rather on an adjacent portion of the first wall of the second box portion 33. Naturally, the second recess in the third box portion is offset correspondingly.

Naturally, the invention is not limited to the embodiments described, but covers any variant coming within the ambit of the invention as defined by the claims.

The first box portion, the second box portion, and the third box portion may be made of materials that are different from one another.

The snap fastening between the first box portion and the second box portion may optionally be releasable, and may make use of snap fastener means presenting shapes other than those described herein.

The adjustment between the box portions may take place along a different axis, or indeed along a plurality of axes in combined manner.

The box may perfectly well include a number of box portions that is greater than 3.

The complementary adjustment means between the second box portion and the third box portion may present shapes that are different, and may for example comprise a peg, a rib, a centering device, etc.

The invention claimed is:

1. A box comprising a first box portion, a second box portion, and a third box portion, the first box portion and the second box portion comprising complementary snap fastener means formed in a wall of the first box portion and in a first wall of the second box portion and arranged so that, when the first box portion and the second box portion are assembled together, and in the absence of the third box portion, axial clearance exists along an axis parallel to the wall of the first box portion and to the first wall of the second box portion, which walls are parallel to each other, the second box portion and the third box portion including complementary adjustment means arranged so that, when the third box portion is assembled with the first box portion and the second box portion, the axial clearance is reduced and the position of the second box portion and of the third box portion is adjusted along the axis.

2. The box according to claim 1, wherein, when the third box portion is assembled with the first box portion and with the second box portion, the third box portion is secured to the first box portion.

3. The box according to claim 2, wherein the third box portion is secured to the first box portion by a screw fastening, by snap fastening, by adhesive, or by thermoplastic staking.

4. The box according to claim 1, wherein the complementary snap fastener means comprise a first recess formed in the wall of the first box portion and a flexible catch tab formed in the thickness of the first wall of the second box portion.

5. The box according to claim 4, wherein the flexible catch tab has a first face presenting a slope facing towards the first recess when the first box portion and the second box portion are assembled together.

6. The box according to claim 1, wherein the complementary adjustment means are formed on the first wall of the second box portion and on a wall of the third box portion.

7. The box according to claim 6, wherein the complementary adjustment means comprise a lug formed on the first wall of the second box portion, and a second recess formed in the wall of the third box portion.

8. The box according to claim 7, wherein the complementary snap fastener means comprise a first recess formed in the wall of the first box portion and a flexible catch tab formed in the thickness of the first wall of the second box portion, wherein the lug is situated on the flexible catch tab.

9. The box according to claim 8, wherein the flexible catch tab has a first face presenting a slope facing towards the first recess when the first box portion and the second box portion are assembled together, wherein the complementary snap fastener means comprise a first recess formed in the wall of the first box portion and a flexible catch tab formed in the thickness of the first wall of the second box portion, wherein the lug is situated on a second face of the flexible catch tab that is opposite from the first face.

10. The box according to claim 6, wherein the complementary adjustment means comprise an end of a second wall of the second box portion that extends orthogonally to the first wall of the second box portion, and a shoulder formed in the wall of the third box portion.

11. A method of making a box according to claim 1, the method comprising the steps of:

assembling together the first box portion, the second box portion, and the third box portion;

securing the third box portion to the first box portion.

* * * * *